(12) United States Patent
Chen et al.

(10) Patent No.: US 8,373,254 B2
(45) Date of Patent: Feb. 12, 2013

(54) STRUCTURE FOR REDUCING INTEGRATED CIRCUIT CORNER PEELING

(75) Inventors: Hsien-Wei Chen, Sinying (TW); Yu-Wen Liu, Taipei (TW); Hao-Yi Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 518 days.

(21) Appl. No.: 12/181,663

(22) Filed: Jul. 29, 2008

(65) Prior Publication Data

US 2010/0025824 A1  Feb. 4, 2010

(51) Int. Cl.
*H01L 21/302* (2006.01)
*H01L 23/58* (2006.01)

(52) U.S. Cl. ......... 257/620; 257/E23.194; 257/E21.214; 438/460; 438/462

(58) Field of Classification Search .................. 257/620, 257/E23.194, E21.214; 438/460, 462
See application file for complete search history.

(56) References Cited

U.S. PATENT DOCUMENTS

| | | | | |
|---|---|---|---|---|
| 7,129,566 | B2 * | 10/2006 | Uehling et al. | 257/620 |
| 7,646,078 | B2 * | 1/2010 | Jeng et al. | 257/620 |
| 2007/0087067 | A1 * | 4/2007 | Yuan et al. | 425/116 |
| 2007/0096092 | A1 * | 5/2007 | Huang et al. | 257/48 |
| 2007/0102792 | A1 * | 5/2007 | Wu | 257/620 |
| 2007/0194409 | A1 * | 8/2007 | Wang et al. | 257/620 |
| 2008/0169533 | A1 * | 7/2008 | Jeng et al. | 257/620 |
| 2009/0201043 | A1 * | 8/2009 | Kaltalioglu | 324/765 |

* cited by examiner

*Primary Examiner* — Peniel M Gumedzoe
(74) *Attorney, Agent, or Firm* — Haynes and Boone, LLP

(57) ABSTRACT

A crack prevention structure that reduces integrated circuit corner peeling and reduces cracking is disclosed. The crack prevention structure comprises a semiconductor substrate; a first plurality of dielectric layers of a first material disposed over the semiconductor substrate; a second plurality of dielectric layers of a second material different than the first material, disposed on the first plurality of dielectric layers, wherein the first plurality of dielectric layers and the second plurality of dielectric layers meet at an interface; and a plurality of metal structures and a plurality of via structures formed through the interface of the first plurality of dielectric layers and the second plurality of dielectric layers.

20 Claims, 6 Drawing Sheets

STRUCTURE FOR REDUCING INTEGRATED CIRCUIT CORNER PEELING

BACKGROUND

In semiconductor processing, a plurality of dies, each containing an integrated circuit, are fabricated on a semiconductor wafer. Scribe lines are provided between adjacent dies so that the dies can be separated without damaging the circuit during processing. Typically, stresses induced by semiconductor back-end processes, such as die-sawing, packing, and plastic modeling, cause serious peeling and cracking starting from the die corners. Existing methods include die saw blade improvement and seal ring consolidation. However, a severe cracking resulting from back-end processing is still observed, particularly in the die corner areas. Additionally, the consolidated seal ring structure costs a portion of precious integrated circuit area inside the die.

Accordingly, what is needed is a cost-effective semiconductor structure that reduces corner peeling and eliminates cracking of the integrated circuits.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
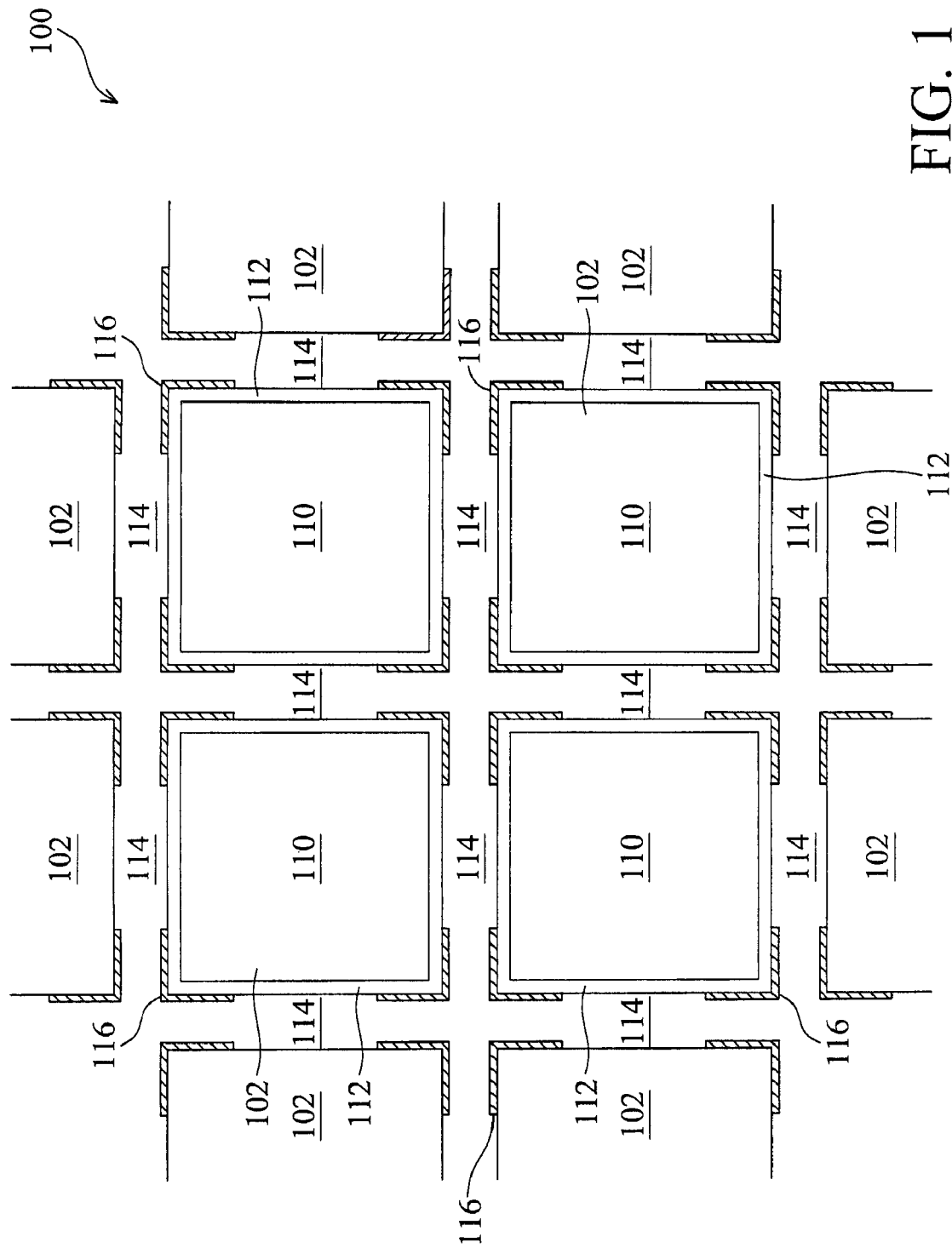
FIG. 1 is a plan view of a semiconductor wafer including a crack prevention structures that reduce corner peeling and eliminate cracking according to one embodiment of the present invention.

The present disclosure relates generally to manufacturing integrated circuits, and more particularly, to a structure that reduces die corner peeling and prevents cracking.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Further, the formation of a first feature adjacent to, proximate to, or next to a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 through 6, a semiconductor wafer 100 including a crack prevention structure 116 for reducing corner peeling and preventing cracking are collectively described below. It is understood that additional features can be added in the semiconductor wafer 100 and the crack prevention structure 116, and some of the features described below can be replaced or eliminated for additional embodiments of the semiconductor wafer 100 and the crack prevention structure 116. The present embodiments of the semiconductor wafer 100 and the crack prevention structure 116 significantly reduce cracking of individual semiconductor dies when the semiconductor wafer goes through back-end processes, such as die-sawing.

Referring to FIG. 1, the semiconductor wafer 100 comprises a plurality of semiconductor dies 102 including an integrated circuit region 110 and a seal ring 112, scribe lines 114, and crack prevention structures 116.

Each semiconductor die 102 includes an integrated circuit region 110 and a seal ring 112. The integrated circuit region 110 may include a variety of electric devices in various embodiments, such as metal-oxide-semiconductor field effect transistors (MOSFETs), bipolar transistors, high power transistors, high frequency transistors, memory cells, devices having fuse features, resistors, capacitors, inductors, other suitable components, or combinations thereof. It is understood that the integrated circuit region 110 may further include other features, such as die-corner-circuit-forbidden (DCCF) regions or registration features.

The seal ring 112 surrounds the perimeter of the integrated circuit region 110. The seal ring 112 creates a barrier to penetration of moisture, corrosive gasses, and chemicals into the interior of the integrated circuit region 110. The seal ring 112 may comprise multiple layers. For example, the seal ring may comprise a plurality of conductive layers, a plurality of insulating layers, a plurality of vias and contacts, a plurality of metal layers, and/or combinations thereof. It is understood that, in some embodiments, the semiconductor die 102 may comprise only an integrated circuit region 110 without a surrounding seal ring 112.

The scribe lines 114 are configured between semiconductor dies 102. When the semiconductor wafer 100 is cut or diced into individual dies, the semiconductor wafer 100 is cut/diced along the scribe lines 114. In some embodiments, the scribe lines 114 may be evenly spaced and parallel to each other. The scribe lines 114 may include various dimensions, such as width.

Dicing the semiconductor wafer 100 into the individual semiconductor dies 102 by sawing along the scribe lines 114 creates high stress on the semiconductor dies 102. Such stress often causes cracking of the semiconductor dies 102, particularly in the corner regions where stress is at a maximum. Typically, the seal ring 112 has provided some protection to the integrated circuit region 110 from cracking; however, cracks and delaminations still occur. To reduce corner peeling and cracking experienced in the semiconductor dies 102, the crack prevention structures 116 are formed in the scribe lines 114 adjacent to the seal ring structure 112. The crack prevention structures 116 provide several advantages including reducing stress caused by the die-sawing process; eliminating cracks in the semiconductor dies 102, especially in the corners; and allowing more area in the integrated circuit region 110 for forming semiconductor devices since the crack prevention structure is formed within scribe lines 114.

Figure 2:
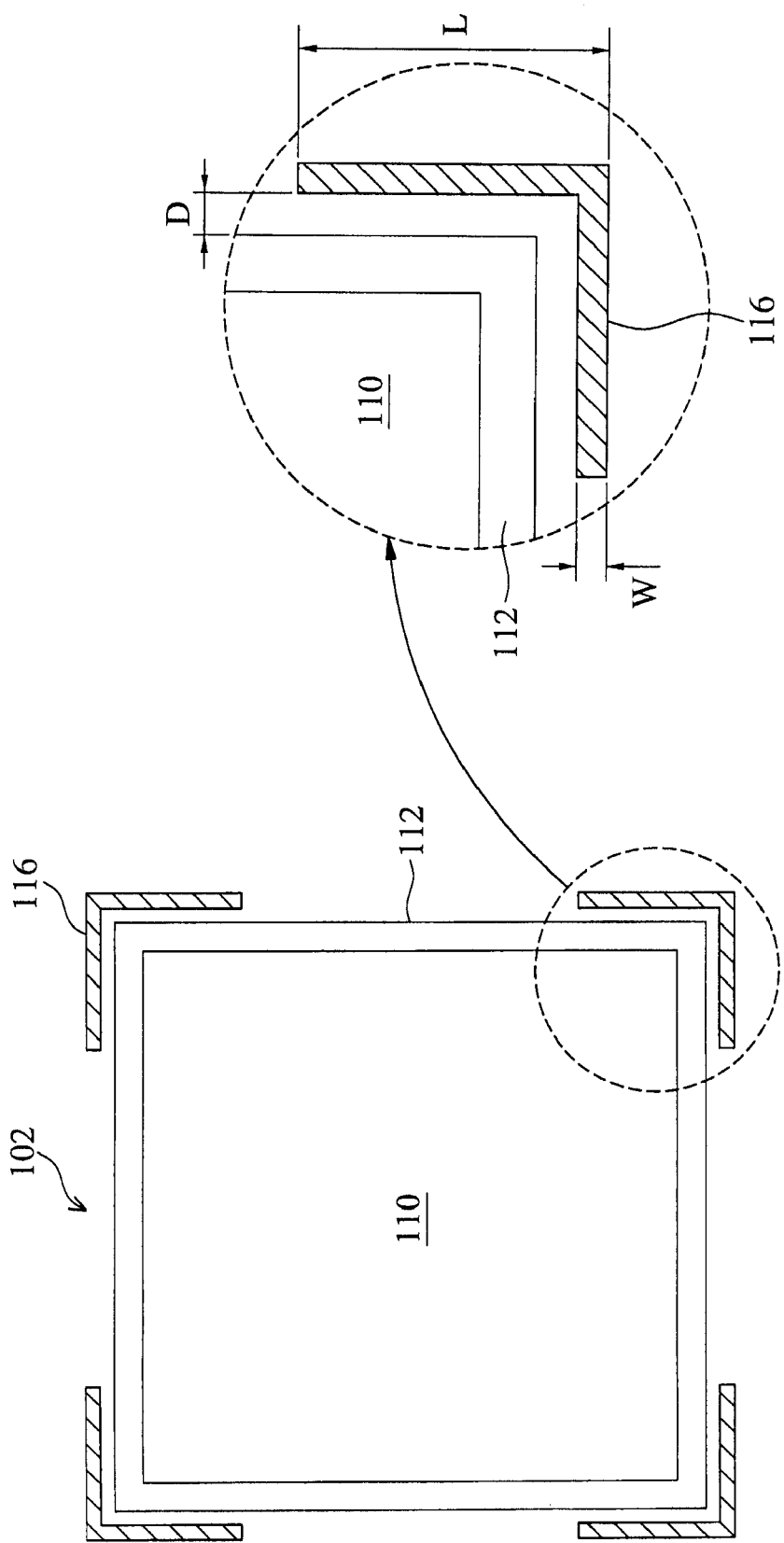
FIG. 2 is a plan view of a semiconductor die and a crack prevention structure that reduces corner peeling and eliminates cracking according to one embodiment of the present invention.

FIG. 2 provides a plan view of a semiconductor die 102 from FIG. 1 with a crack prevention structure 116 formed at each corner of the semiconductor die 102 in an L-shape. A magnified view of one corner of the semiconductor die 102 illustrates that the crack prevention structure 116 comprises a length L and a width W. Distance D represents the space between the seal ring structure 112 of semiconductor die 102 and the crack prevention structure 116, or in alternate embodiments, may represent the space between the integrated circuit region 110 and the crack prevention structure 116. The various dimensions of crack prevention structure 116, such as the length L, width W, and distance D, may comprise any suitable value. In some embodiments, the crack prevention structure 116 has a length L of approximately 155 microns. In some embodiments, the crack prevention structure 116 has a width W of approximately 2 microns. In some embodiments, the distance D between the seal ring structure 112 and the crack prevention structure 116 ranges from approximately 0 microns to 2 microns.

Figure 3:
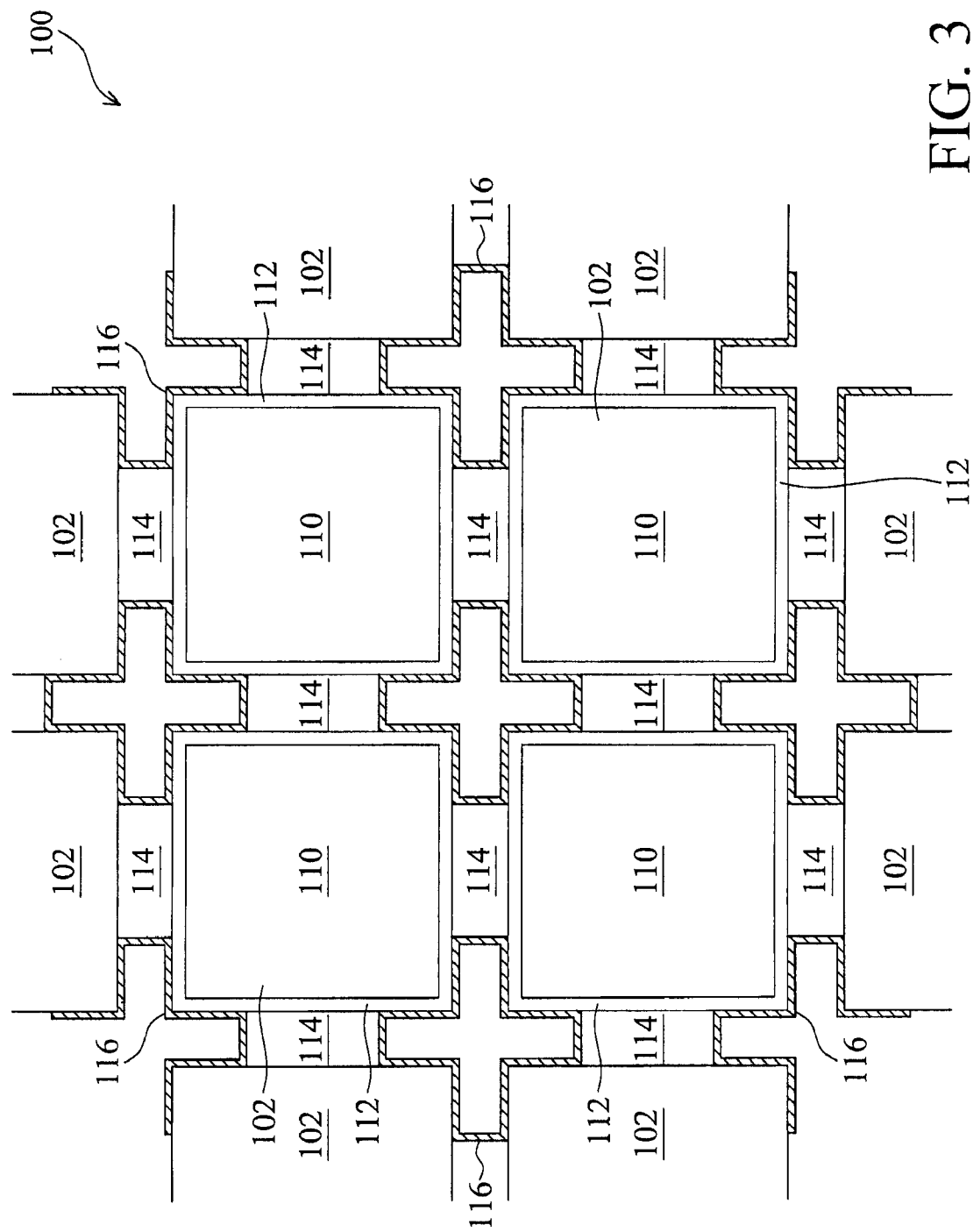
FIGS. 3-5 are plan views of semiconductor wafers including crack prevention structures that reduce corner peeling and eliminate cracking according to alternate embodiments of the present invention.
Figure 4:
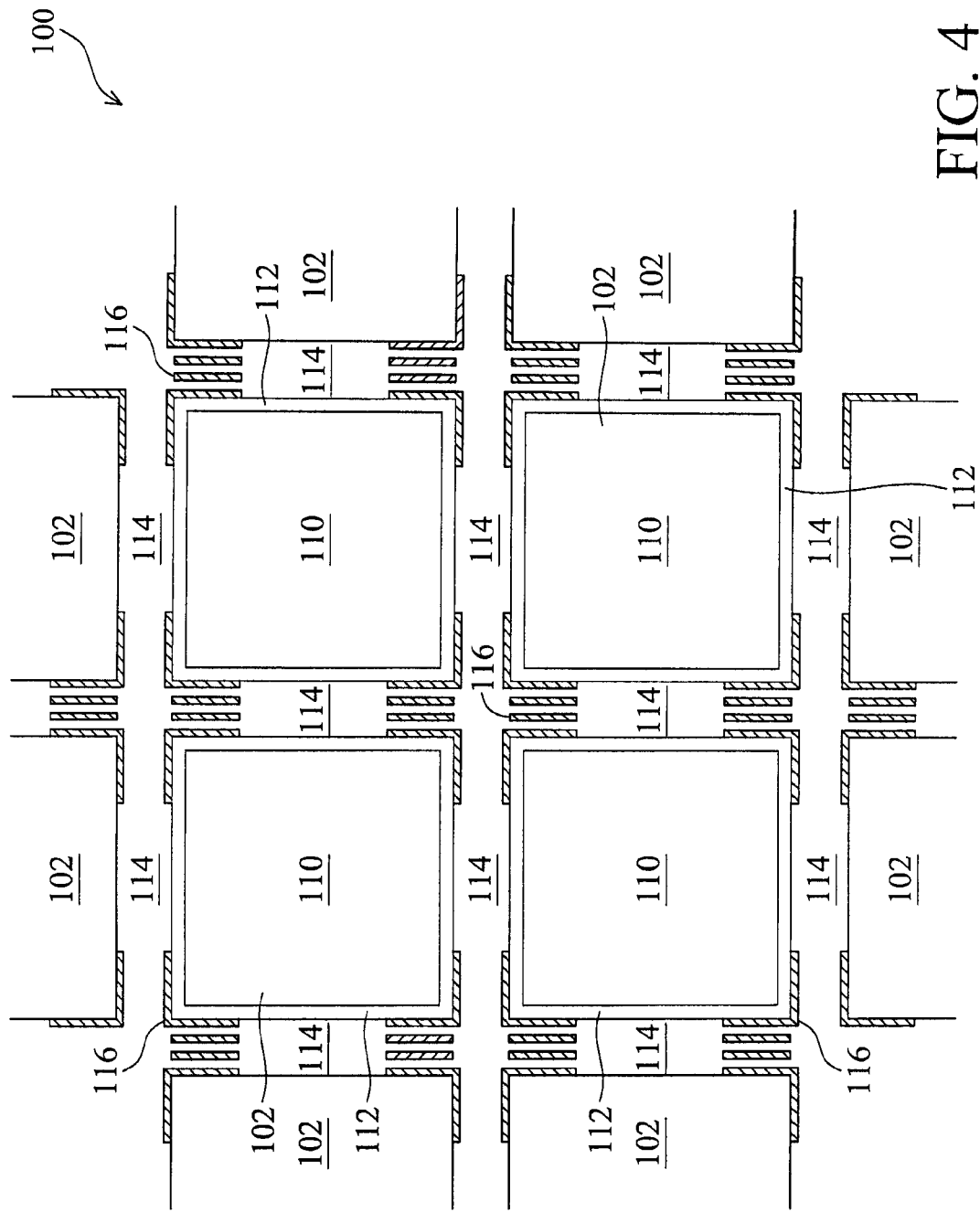
Figure 5:
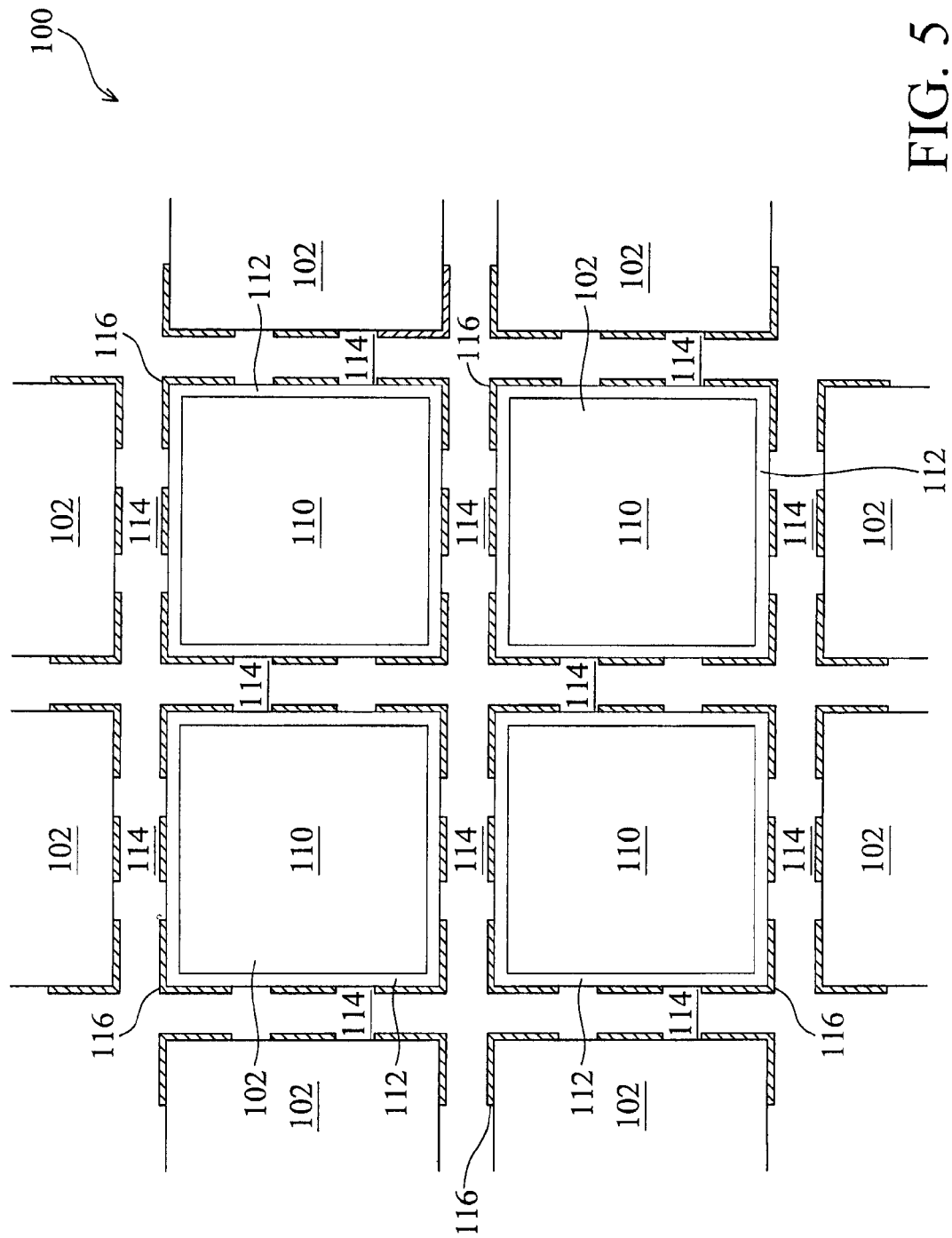

The crack prevention structures 116 may take on any shape and be strategically placed within scribe lines 114 to effectively eliminate cracking caused during back-end processes such as die-sawing. In some embodiments, as shown in FIG. 1, the crack prevention structures 116 are formed in an L-shape at each corner of the semiconductor die 102. In alternate embodiments, the crack prevention structure 116 may comprise any suitable shape, such as a rectangular shape, a series of rectangular features, a T-shape, an octagon-shape, a right triangle-shape, a cross-shape, any other suitable shapes, and/or combinations thereof. It is understood that the crack prevention structures 116 may comprise corner structures, sidewall structures, structures dispersed throughout the scribe lines, and/or combinations thereof. The crack prevention structures 116 may comprise continuous lines, non-continuous lines, or combinations thereof. The crack prevention structures 116 may comprise a single line, multiple lines, or combinations thereof. The crack prevention structures 116 may surround the perimeter of the semiconductor dies 102. In some embodiments, as shown in FIG. 3, the crack prevention structures 116 may be in the form of a cross-shape. Referring to FIG. 4, in some embodiments, a semiconductor wafer 100 includes crack prevention structures 116 formed at each corner of semiconductor dies 102 and crack prevention structures 116 formed as multiple parallel lines within scribe lines 114 at varying distances from the semiconductor dies 102. In some embodiments, as shown in FIG. 5, the crack prevention structures 116 surround the perimeter of the semiconductor die 102 as a non-continuous line. It is further understood that the placement of crack prevention structures 116 is not limited by FIG. 1 or FIGS. 3-5 as discussed above.

Figure 6:
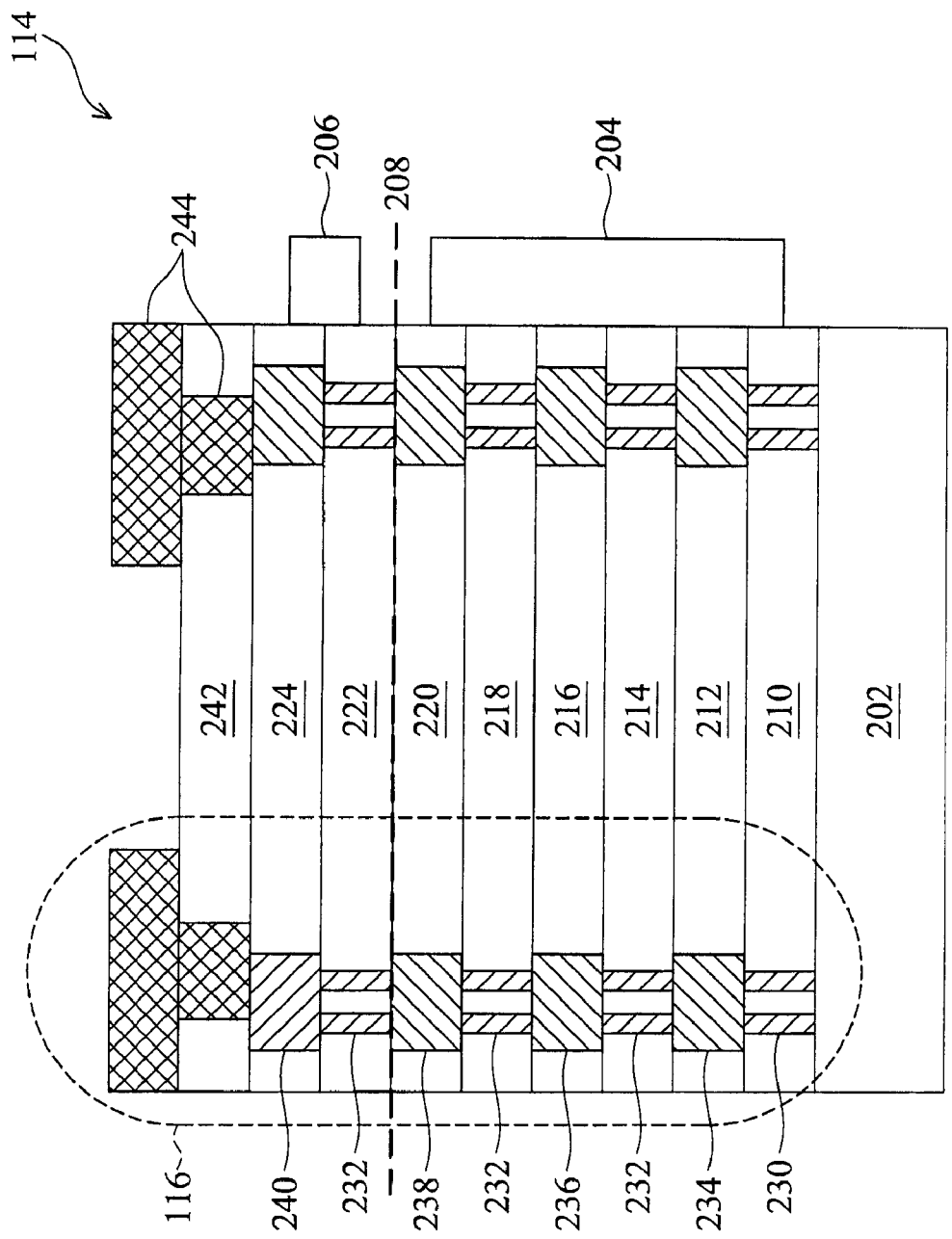
FIG. 6 is a cross-section of a scribe line including a crack prevention structure that reduces corner peeling and eliminates cracking according to one embodiment of the present invention.

FIG. 6 provides a cross-section of a scribe line 114 including a crack prevention structure 116 according to one embodiment. The scribe line 114 comprises a semiconductor substrate 202; a first plurality of dielectric layers 204 including dielectric layers 210, 212, 214, 216, 218, and 220; a second plurality of dielectric layers 206 including dielectric layers 222 and 224; an interface 208; the crack prevention structure 116 including a plurality of via structures 230, 232, and a plurality of metal structures 234, 236, 238, and 240; and a passivation layer 242 including a bond/bump pad structure 244. The plurality of via structures 230, 232 may comprise discontinuous square holes, continuous via bars, and/or combinations thereof.

The semiconductor substrate 202 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure. The semiconductor substrate 202 may be doped, either heavily or lightly, with p-type or n-type dopants. For example, the semiconductor substrate 202 may be doped with p-type dopants, such as boron or $BF_2$. Alternatively, the semiconductor substrate 202 may be doped with n-type dopants, such as phosphorus or arsenic.

The first plurality of dielectric layers 204 is disposed above the semiconductor substrate 202. The first plurality of dielectric layers 204 includes dielectric layers 210, 212, 214, 216, 218, and 220. The second plurality of dielectric layers 206 is disposed above the first plurality of dielectric layers 204. The second plurality of dielectric layers 206 include dielectric layers 222 and 224. In alternate embodiments, the first plurality of dielectric layers 204 and the second plurality of dielectric layers 206 may comprise more or less dielectric layers than those provided in FIG. 6.

In one embodiment, the first plurality of dielectric layers 204 and the second plurality of dielectric layers 206 include different dielectric materials. It is advantageous to form the first plurality of dielectric layers 204 from low-K (LK), ultra low-K (ULK), extra low-K (ELK), and/or XLK materials in order to enhance circuit performance. The material classification is based upon capacitance or k value, with LK usually referring to those materials with a k between about 3.1 to 2.7, ULK usually referring to those materials with a k between about 2.7 to 2.4, ELK usually referring to those materials with a k between about 2.3 to 2.0, and XLK referring to those materials which typically have a k value less than about 2.0. The LK, ULK, ELK, and/or XLK dielectric materials may comprise silicon oxide, silicon nitride, silicon oxynitride, spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, other proper porous polymeric materials, other suitable dielectric materials, and/or combinations thereof. The first and second plurality of dielectric layers 204/206 may be formed by a suitable process, such as spin-on coating, chemical vapor deposition (CVD), physical vapor deposition (PVD), atomic layer deposition (ALD), other suitable processes, and/or combinations thereof.

In one embodiment, the second plurality of dielectric layers 206 includes a undoped silica glass (USG). For example, the first plurality of dielectric layers 204 includes a LK material, and the second plurality of dielectric layers 206 includes USG. The interface 208 represents where the first plurality of dielectric layers 204 and the second plurality of dielectric layers 206 meet (i.e., the interface between dielectric layer 220 and dielectric layer 222). In alternate embodiments, any combination of LK, ULK, ELK, XLK, USG, Boron-Doped Phosphosilicate Glass (BPSG), and other suitable dielectric materials may be utilized to form the first and second plurality of dielectric layers.

Though the LK, ULK, ELK, and XLK dielectric materials enhance circuit performance, such materials exhibit poor mechanical strength and thus tend to severely crack under stresses induced by die-sawing, particularly at the interface 208 of the first plurality of dielectric layers 204 and the second plurality of dielectric layers 206. The crack prevention structure 116 effectively reduces such stresses and eliminates cracking.

The crack prevention structure 116 comprises a dummy metal pattern that includes the plurality of contact or via structures 230, 232 coupled between the plurality of metal structures 234, 236, 238, and 240 disposed over substrate 202. The dummy metal pattern may be similar to multilayer interconnects formed in the integrated circuit region 110 in composition and formation. The plurality of contact/via structures 230, 232 and the plurality of metal structures 234, 236, 238, and 240 may be formed in an integrated process, such as a damascene process or a dual damascene process, and further, vertical and horizontal features may be formed in various processes, such as photolithography and etching processes. The plurality of contact/via structure 230, 232 may comprise discontinuous square holes, continuous via bars, and/or combinations thereof. In addition, the plurality of contact/via structures 230, 232 and the plurality of metal structures 234, 236, 238, and 240 may comprise aluminum, aluminum alloy, copper, copper alloy, titanium, titanium nitride, tantalum, tantalum nitride, tungsten, polysilicon, metal silicide, other suitable materials, and/or combinations thereof.

The plurality of metal structures 234, 236, 238, and 240 may include N metal structures, where the topmost metal structure is M(N). In the present embodiment, the plurality of metal structures comprises four metal structures, M1 through M4, metal structure 232 being M1, . . . metal structure 236 being M(n−1) or M3, and metal structure 238 being the topmost metal structure, M(N), or M4. Although only metal one (M1) through metal four (M4) metallization layers are illustrated, it is understood that the crack prevention structure 116 may comprise any number of contact, via, and metal structures, dependent on device complexity and design of the particular semiconductor wafer. For example, in some embodiments, the crack prevention structure 116 may comprise metal structures M1 through M9. The plurality of contact structures 230 may be configured to couple the substrate 202 to the metal structure 234, or in alternate embodiments to metal structure M1. The plurality of via structures 232 may include various contacts or vias that are configured to couple one metal structure to another metal structure, such as metal structure 234 to metal structure 236, or metal structure M2 to M3, etc.

The plurality of contact or via structures 230, 232 and the plurality of metal structures 234, 236, 238, and 240 may be formed within the first and second plurality of dielectric layers 204, 206. The first and second plurality of dielectric layers 204, 206 insulate the metal structures 234, 236, 238, and 240 from one another. As noted above, the interface 208 represents where the first plurality of dielectric layers 204 and the second plurality of dielectric layers 206 meet. Cracking tends to be most severe at interface 208 where the first dielectric material meets with the second dielectric material. The crack prevention structure 116 comprising the dummy metal pattern prevents cracking from occurring at the interface 208. In the present embodiment, the crack prevention structure extends entirely throughout the first and second plurality of dielectric layers 204, 206 and through the interface 208. By extending through the interface 208, the crack prevention structure 116 effectively eliminates cracking. In alternate embodiments, the crack prevention structure 116 may only extend from the topmost metal structure 240 or M(N) to the interface 208; may extend from the topmost metal structure 240 or M(N) to various dielectric layers, such as to dielectric layer 220 or dielectric layer 214; may only be formed at the interface 208; may extend only through the first plurality of dielectric layers 204 or only through the second plurality of dielectric layers 206; may extend as a continuous line of contact/via and metal structures or a non-continuous line of contact/via and metal structures; any other suitable way; and/or combinations thereof to reduce corner peeling and prevent cracking.

The passivation layer 242 may be deposited above the second plurality of dielectric layers 204 including the topmost metal layer to cover and protect the metal structures and first and second plurality of dielectric layers 204, 206. The passivation layer 242 may comprise silicon oxide, silicon nitride, silicon oxynitride, any other suitable material, and/or combinations thereof. Further, the passivation layer 242 may be formed by chemical vapor deposition (CVD), spin-on coating, or other suitable techniques.

The crack prevention structure 116 may further include a bond/bump pad structure 244 formed on the topmost metal structure 240 (i.e., metal structure M(N)). The bond/bump pad structure 244 may be formed within the passivation layer 242 by a process known in the art. The bond/bump pad structure 234 may comprise an electrically conductive material, such as aluminum, aluminum alloy, copper, copper alloy, other suitable conductive materials, and/or combinations thereof.

Overall, the disclosed embodiments provide one or more of the following advantages: (1) the crack prevention structure effectively releases stress induced by the integrated circuit manufacturing back-end processes, such as dicing/die-sawing; (2) the crack prevention structure is formed within the scribe lines, thus not occupying the integrated circuit region; (3) by releasing induced stresses, the crack prevention structure effectively reduces corner peeling and eliminates cracking during the die-sawing process; (4) the crack prevention structure improves yield; (5) the crack prevention structure is easily fabricated at a low cost without requiring any additional expenses; (6) the crack prevention structure may be fabricated without affecting other processes required to manufacture semiconductor wafers/dies; and (7) the crack prevention structure extends to and or through the interface between the first and second dielectric materials where stress tends to be heightened.

In summary, a crack prevention structure is provided that effectively reduces corner peeling and eliminates cracks. In one embodiment, a plurality of semiconductor dies are disposed between scribe lines, wherein the scribe lines include at least one crack prevention structure, the crack prevention structure comprising: a semiconductor substrate; a first plurality of dielectric layers and a second plurality of dielectric layers disposed over the semiconductor substrate; and a plurality of metal structures and a plurality of via structures formed through at least one of the first plurality of dielectric layers and the second plurality of dielectric layers overlying the semiconductor substrate.

The present disclosure provides a plurality of semiconductor dies disposed between scribe lines, wherein the scribe lines include at least one crack prevention structure. The crack prevention structure includes a semiconductor substrate; a first plurality of dielectric layers of a first material disposed over the semiconductor substrate; a second plurality of dielectric layers of a second material different than the first material, disposed on the first plurality of dielectric layers, wherein the first plurality of dielectric layers and the second plurality of dielectric layers meet at an interface; and a plurality of metal structures and a plurality of via structures formed through the interface of the first plurality of dielectric layers and the second plurality of dielectric layers.

In one embodiment, the first material includes a low-K dielectric material. Alternatively, the first material includes an ultra low-K, extra low-K, XLK, or combination thereof dielectric material. In another embodiment, the second material includes undoped silica glass (USG). In various embodiments, the plurality of metal structures and the plurality of via structures may extend through the second plurality of dielectric layers. The plurality of metal structures and the plurality of via structures may extend through the first plurality of dielectric layers. The plurality of metal structures and the plurality of via structures may extend through all of the first and second plurality of dielectric layers. The crack prevention structure may further include a bond/bump pad structure formed on a passivation layer overlying the first and second plurality of dielectric layers. The plurality of via structures are in between the plurality of metal structures. The plurality of via structures interconnect the plurality of metal structures. The crack prevention structure may further include a plurality of contact structures. The contact structures interconnect the plurality of metal structures to the semiconductor substrate.

The present disclosure also provides a semiconductor wafer. The semiconductor wafer includes a plurality of semiconductor dies; a plurality of scribe lines interposed between adjacent semiconductor dies; and a crack prevention structure formed within the plurality of scribe lines proximate to a corner of a semiconductor die.

In various embodiments, the semiconductor die may further includes a seal ring around the perimeter of the semiconductor die. The semiconductor die and the crack prevention structure are spaced apart by a distance D. The crack prevention structure includes metal. The semiconductor wafer may further include an additional crack prevention structure formed within the scribe lines and proximate to sidewalls of the semiconductor die. The crack prevention structure may include at least one of a continuous line, a non-continuous line, multiple continuous lines, multiple non-continuous lines, or a combination thereof. The crack prevention structure may include at least one of an L-shape, a cross shape, a rectangular shape, a series of rectangular features, a T-shape, an octagon-shape, a right triangle-shape, or combinations thereof. The crack prevention structure may extend through only a topmost metal layer.

The present disclosure also provides one embodiment of a integrated circuit fabrication method. The method includes forming a plurality of semiconductor dies on a semiconductor substrate; and forming a crack prevention structure within a scribe line wherein the scribe line is interposed between two adjacent semiconductor dies, in which the crack prevention structure includes a first plurality of dielectric layers of a first material disposed over the semiconductor substrate; a second plurality of dielectric layers of a second material different than the first material, disposed on the first plurality of dielectric layers, wherein the first plurality of dielectric layers and the second plurality of dielectric layers meet at an interface; and a plurality of metal structures and a plurality of via structures formed through the interface of the first plurality of dielectric layers and the second plurality of dielectric layers. In one embodiment, the forming of the crack prevention structure includes forming the crack prevention structure approximate to a corner of semiconductor die.

In some embodiments, the first plurality of dielectric layers, comprising a first material, is disposed over the semiconductor substrate, and the second plurality of dielectric layers, comprising a second material different than the first material, is disposed over the first plurality of dielectric layers. In some embodiments, the first plurality of dielectric layers and the second plurality of dielectric layers meet at an interface. In some embodiments, the first material comprises a low-K dielectric material. In some embodiments, the second material comprises an ultra low-K, extra low-K, or XLK dielectric material.

In some embodiments, the plurality of metal structures and the plurality of via structures extends through at least the interface. In some embodiments, the plurality of metal structures and the plurality of via structures extends to the interface. In some embodiments, the second plurality of dielectric layers comprises a topmost layer, wherein the plurality of metal structures and the plurality of via structures extends through only the topmost layer. In some embodiments, the plurality of metal structures and the plurality of via structures extends through all of the first and second plurality of dielectric layers.

In some embodiments, a passivation layer including a bond/bump pad structure is formed over the first and second plurality of dielectric layers. In some embodiments, the plurality of via structures are in between the plurality of metal structures, the plurality of via structures interconnecting the plurality of metal structures. In some embodiments, the plurality of via structures comprises a plurality of contact structures, the contact structures interconnecting the plurality of metal structures to the semiconductor substrate.

In one embodiment, a semiconductor wafer comprises: at least one semiconductor die; a plurality of scribe lines disposed around the at least one semiconductor die; and at least one crack prevention structure formed within the plurality of scribe lines proximate to the at least one semiconductor die. In some embodiments, the at least one semiconductor die further comprises a seal ring around the perimeter of the semiconductor die.

In some embodiments, the at least one semiconductor die and the at least one crack prevention structure are spaced apart by a distance D. In some embodiments, the at least one crack prevention structure comprises metal. In some embodiments, the at least one crack prevention structure is proximate to the corners, sidewalls, or a combination thereof of the at least one semiconductor die. In some embodiments, the at least one crack prevention structure comprises at least one of a continuous line, a non-continuous line, multiple continuous lines, multiple non-continuous lines, or a combination thereof. In some embodiments, the at least one crack prevention structure comprises at least one of an L-shape, a cross shape, a rectangular shape, a series of rectangular features, a T-shape, an octagon-shape, a right triangle-shape, or combinations thereof.

In one embodiment, a crack prevention structure comprises: a semiconductor substrate; a plurality of metal layers formed over the semiconductor substrate; a plurality of via structures formed through a plurality of dielectric layers between said plurality of metal layers, wherein said via structures interconnect said metal layers; and an interface within the plurality of dielectric layers, the interface comprising where dielectric layers of different K values meet, wherein the plurality of metal layers and the plurality of via structures extend either at least through the interface or to the interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a plurality of semiconductor dies disposed between scribe lines, wherein the scribe lines include at least one crack prevention structure disposed over a semiconductor substrate, the at least one crack prevention structure comprising:
   a first plurality of dielectric layers of a first material disposed over the semiconductor substrate;
   a second plurality of dielectric layers of a second material different than the first material disposed over the first plurality of dielectric layers, wherein the first plurality of dielectric layers and the second plurality of dielectric layers meet at an interface;
   a plurality of metal structures and a plurality of via structures formed through the interface of the first plurality of dielectric layers and the second plurality of dielectric layers; and
   a bond/bump pad structure disposed in a passivation layer overlying the first and second plurality of dielectric layers, the bond/bump pad structure being coupled with a topmost metal structure of the plurality of metal structures,
   wherein the at least one crack prevention structure continuously extends within the scribe lines adjacent to at least a portion of a first side and a second side of one of the semiconductor dies without extending beyond the first side and the second side.

2. The device of claim 1 wherein the first material comprises a low-K dielectric material.

3. The device of claim 1 wherein the first material comprises an ultra low-K, extra low-K, XLK, or combination thereof dielectric material.

4. The device of claim 1 wherein the second material comprises undoped silica glass (USG).

5. The device of claim 1 wherein the plurality of metal structures and the plurality of via structures extends through at least the second plurality of dielectric layers.

6. The device of claim 1 wherein the plurality of metal structures and the plurality of via structures extends through at least the first plurality of dielectric layers.

7. The device of claim 1 wherein the plurality of metal structures and the plurality of via structures extends through all of the first and second plurality of dielectric layers.

8. The device of claim 1 wherein the plurality of via structures are in between the plurality of metal structures, the plurality of via structures interconnecting the plurality of metal structures.

9. The device of claim 1 further comprising a plurality of contact structures, the contact structures interconnecting the plurality of metal structures to the semiconductor substrate.

10. A semiconductor wafer comprising:
    a first integrated circuit device region and a second integrated circuit device region;
    a scribe line disposed between the first integrated circuit device region and the second integrated circuit device region; and
    a crack prevention structure disposed within the scribe line, the crack prevention structure being a continuous structure that includes:
    a first continuous L-shaped line portion proximate to a corner of the first integrated circuit device region such that the first continuous L-shaped line portion is disposed along at least two sides of the first integrated circuit device region;
    a second continuous L-shaped line portion proximate to a corner of the second integrated circuit device region such that the second continuous L-shaped line portion is disposed along at least two sides of the second integrated circuit device region; and
    a third continuous line portion extending from the first continuous L-shaped line portion to the second continuous L-shaped line portion thereby connecting the first and second continuous L-shaped line portions to form the continuous structure.

11. The semiconductor wafer of claim 10 further comprising a seal ring disposed between the crack prevention structure and the first integrated device region, the seal ring disposed along the perimeter of the first integrated circuit device region.

12. The semiconductor wafer of claim 11 wherein the crack prevention structure is spaced a predetermined distance from the seal ring.

13. The semiconductor wafer of claim 10 wherein the crack prevention structure comprises metal.

14. The semiconductor wafer of claim 10 further comprising a fourth continuous L-shaped line portion disposed within the scribe line and proximate to a corner of a third integrated circuit device region such that the fourth continuous L-shaped line portion is disposed along at least two sides of the third integrated circuit device region.

15. A method comprising:
    forming a plurality of semiconductor dies on a semiconductor substrate; and
    forming a crack prevention structure within a scribe line wherein the scribe line is interposed between two adjacent semiconductor dies, wherein the crack prevention structure includes:
    a first plurality of dielectric layers of a first material disposed over the semiconductor substrate;
    a second plurality of dielectric layers of a second material different than the first material disposed over the first plurality of dielectric layers, wherein the first plurality of dielectric layers and the second plurality of dielectric layers meet at an interface;
    a plurality of metal structures and a plurality of via structures formed through the interface of the first plurality of dielectric layers and the second plurality of dielectric layers; and
    a bond/bump pad structure disposed in a passivation layer overlying the first and second plurality of dielectric layers, the bond/bump pad structure being coupled with a topmost metal structure of the plurality of metal structures, wherein the crack prevention structure continuously extends within the scribe lines adjacent to at least a portion of a first side and a second side of one of the semiconductor dies without extending beyond the first side and the second side.

16. The method of claim 15 wherein the forming of the crack prevention structure comprises forming the crack prevention structure proximate to a corner of a semiconductor die.

17. The device of claim 1, wherein the at least one crack prevention structure is a continuous line structure that includes:
   a first continuous line portion proximate to a corner of a first die of the plurality of dies such that the first continuous line portion is disposed along at least two sides of the first die;
   a second continuous line portion proximate to a corner of a second die of the plurality of dies such that the second continuous line portion is disposed along at least two sides of the second die; and
   a third continuous line portion extending from the first continuous line portion to the second continuous line portion thereby connecting the first and second continuous line portions to form the continuous line structure.

18. The semiconductor wafer of claim 10, wherein the crack prevention structure includes a bond/bump pad structure disposed in a passivation layer, the bond/bump pad structure being coupled with a topmost metal structure.

19. The semiconductor wafer of claim 10, wherein the first continuous L-shaped line portion continuously extends within the scribe line along the at least two sides of the first integrated circuit device region without extending beyond the at least two sides of the first integrated circuit device region.

20. The semiconductor wafer of claim 10, wherein the first integrated circuit device region includes a first die and the second integrated circuit device region includes a second die, the first die being separated from the second die.

* * * * *